United States Patent
Drapkin et al.

(10) Patent No.: US 8,238,067 B2
(45) Date of Patent: Aug. 7, 2012

(54) ELECTROSTATIC DISCHARGE CIRCUIT AND METHOD

(75) Inventors: Oleg Drapkin, Richmond Hill (CA); Grigori Temkin, Markham (CA); Peter Bade, North York (CA)

(73) Assignee: ATI Technologies ULC, Markham, Ontario (CA)

( * ) Notice: Subject to any disclaimer, the term of this patent is extended or adjusted under 35 U.S.C. 154(b) by 522 days.

(21) Appl. No.: 12/332,651

(22) Filed: Dec. 11, 2008

(65) Prior Publication Data

US 2010/0149701 A1    Jun. 17, 2010

(51) Int. Cl.
*H02H 9/00* (2006.01)
(52) U.S. Cl. ............ 361/56; 361/54; 361/91.1; 361/111
(58) Field of Classification Search .................. 361/54, 361/56, 91.1, 91.3, 110, 111
See application file for complete search history.

(56) References Cited

U.S. PATENT DOCUMENTS

| | | | |
|---|---|---|---|
| 6,400,546 B1 * | 6/2002 | Drapkin et al. ............... 361/111 |
| 6,459,553 B1 * | 10/2002 | Drapkin et al. ............... 361/56 |
| 6,552,886 B1 * | 4/2003 | Wu et al. ............... 361/56 |
| 6,690,555 B1 * | 2/2004 | Pasqualini ............... 361/56 |
| 6,828,842 B2 * | 12/2004 | Saito et al. ............... 327/318 |
| 2004/0136126 A1 * | 7/2004 | Smith ............... 361/56 |
| 2006/0103998 A1 * | 5/2006 | Smith ............... 361/91.1 |
| 2007/0008667 A1 * | 1/2007 | Steinhoff ............... 361/56 |
| 2007/0285854 A1 * | 12/2007 | Rodgers et al. ............... 361/56 |
| 2008/0007882 A1 * | 1/2008 | Bernard et al. ............... 361/56 |

* cited by examiner

*Primary Examiner* — Patrick Salce
(74) *Attorney, Agent, or Firm* — Faegre Baker Daniels LLP

(57) ABSTRACT

A method and integrated circuit renders a shunt structure non-conductive during a power up event or noise event for and in addition, during an electrostatic discharge event, keeps the shunt structure conductive for a period of time to discharge electrostatic energy through the shunt structure. In one example, a shunt structure, such as a transistor, is interposed between a power node and a ground node. Circuitry is operative during a power up event or noise event, to render the shunt structure non-conductive for a period of time during the power up event or during the noise event (when power is applied). Second circuit is operative, during an electrostatic discharge event, to keep the shunt structure conductive for a period of time to discharge electrostatic energy through the shunt structure. In one example, a plurality of resistor/capacitors (RC) circuits are utilized wherein the RC circuits have different time constants. In addition, an ESD feedback circuit is employed in conjunction with control logic to suitably control the ESD control logic during an ESD event. Circuitry is also used during a power up event to render the shunt structure non-conductive.

17 Claims, 3 Drawing Sheets

ELECTROSTATIC DISCHARGE CIRCUIT AND METHOD

FIELD OF THE INVENTION

The disclosure relates to electrostatic discharge circuits and methods and circuits relating to power up protection circuits.

BACKGROUND OF THE INVENTION

Integrated circuit pins are susceptible to receiving electrostatic discharge (ESD) pulses during the assembling process, and in some instances during normal operation. Improper dissipation of electrostatic discharge pulses can result in the damage to the circuit components in the integrated circuit. Existing ESD protection circuits can prevent damage from electrostatic discharges but can create reliability problems during the normal operation of the integrated circuit. For example, a disadvantage of known ESD protection circuits is the possibility of the power to ground shortage during a fast power up condition where the power ramps up at a fast rate when applied to the power nodes of the chip. In addition, known ESD protection circuits may create reliability problems caused by high frequency noise of voltage supply and ground that may be present on a power supply and ground nodes or rails. Hence, ESD protection circuits can cause latch up and integrated circuit damage during normal operation of a chip.

FIG. 1 illustrates a known ESD protection circuit 100 that includes a resistor/capacitor (RC) block 102 including an RC circuit that is coupled with a chain of inverters 104. Diodes 106 and 108 are also coupled to the I/O pin 110. A shunt structure 112, in this example an NMOS transistor, is turned "on" to sink ESD discharge current to significantly decrease the integrated circuit ESD over voltage condition to avoid integrated circuit damage. The RC time constant of the RC block 102 is set to be a longer time and much larger typically than the rising time of an expected ESD pulse to provide enough time for the shunt structure 112 to be in the "on" condition.

However, during a power up event in the case of a fast power up condition or for high frequency power/ground noise, the large time constant for the RC circuit 102 may cause the short of the power rail node 114 to the ground node 116 through shunt structure 112 which may result in a latch up condition and damage to the integrated circuit. A smaller RC time constant could prevent the shunt structure 112 from seeking current (current spikes) but would make an ESD condition less defensible and not efficient.

Therefore, a need exists that overcomes one or more of the above problems.

BRIEF DESCRIPTION OF THE DRAWINGS

The invention will be more readily understood in view of the following description when accompanied by the below figures and wherein like reference numerals represent like elements, wherein.

DETAILED DESCRIPTION OF THE PREFERRED EMBODIMENTS

Briefly, a method and integrated circuit renders a shunt structure non-conductive during a power up event for a period of time or during a noise event and in addition, during an electrostatic discharge event, keeps the shunt structure conductive for a period of time to discharge electrostatic energy through the shunt structure. In one example, a shunt structure, such as a transistor, is interposed between a power node and a ground node. A first circuit is operative during a power up event or noise event, to render the shunt structure non-conductive for a period of time during the power up event or during the noise event (when power is applied). A second circuit is operative, during an electrostatic discharge event, to keep the shunt structure conductive for a period of time to discharge electrostatic energy through the shunt structure. In one example, a plurality of resistor/capacitor blocks (RC blocks) are utilized wherein the RC blocks have different time constants. In addition, an ESD feedback circuit is employed in conjunction with control circuitry to suitably control the ESD control logic during an ESD event. Circuitry is also used during a power up event to render the shunt structure non-conductive.

Among other advantages, the latch up conditions are eliminated and the probability for chip or integrated circuit damage due to a possible power rail to ground shortage condition during power up is reduced. In addition, efficient ESD protection is also provided.

Figure 2:
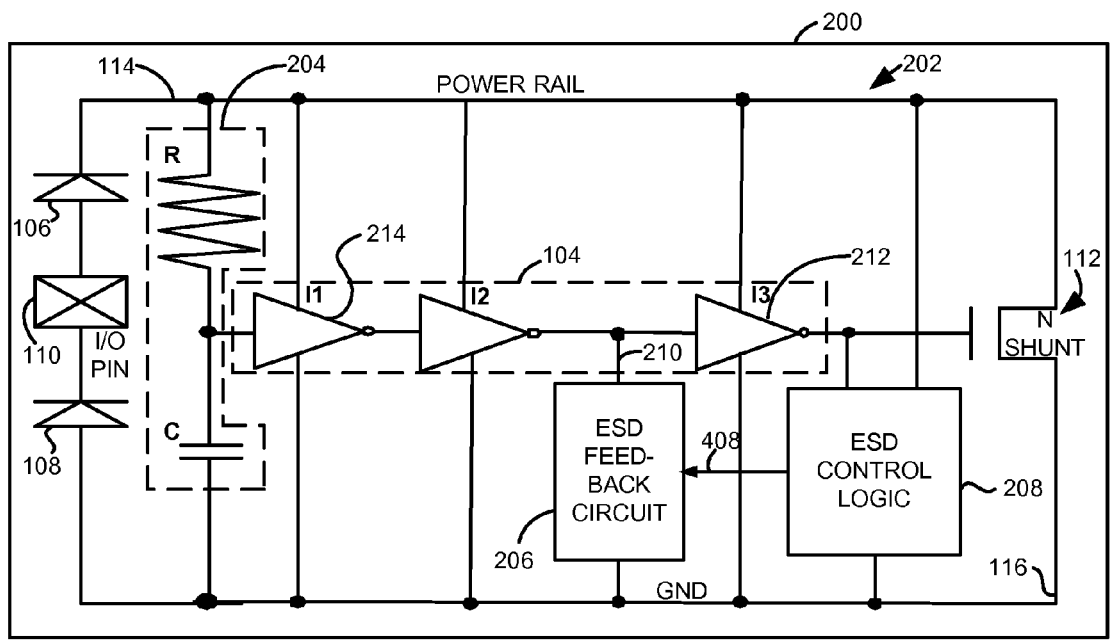
FIG. 2 is a circuit diagram illustrating one example of an electrostatic discharge protection circuit and power up protection circuit in accordance with one example set forth in the disclosure.

FIG. 2 illustrates one example of an integrated circuit 200, such as but not limited to, an ASIC, a central processing unit, video processor, or any other suitable integrated circuit that requires the circuitry set forth below. The integrated circuit 200 is shown to include a portion of an ESD and power up protection circuit 202 that is duplicated if desired, for each pin 110 (or set of pins like 110) that can receive an ESD pulse. However, the circuitry may be employed on any suitable pin or node as desired. The integrated circuit 200 includes the shunt structure 112 shown in this example to be an NMOS transistor that in this example is interposed between the power node 114 and the ground node 116. The power rail may be any suitable voltage level such as 1.8 volts, 1.0 volts, or any other suitable voltage level as desired. Also as used herein ground need not be a 0 volt potential but may be any reference voltage compared to the power node as desired.

Figure 1:
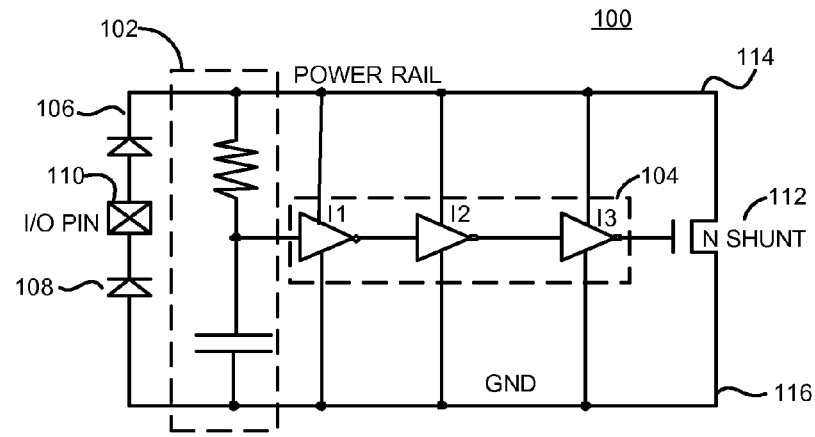
FIG. 1 is a circuit diagram illustrating one example of a prior art electrostatic discharge protection circuit.

First circuit 204 is operative during a power up event to render the shunt structure 112 non-conductive for a period of time during a power up event or during a noise event. The first circuit 204 in this example includes a resistor/capacitor (RC) circuit having a time constant, in one example on the order of approximately 10 nanoseconds, which is smaller than the RC circuit 102 time constant of FIG. 1. However, any suitable time constant may be employed. The integrated circuit 200 also includes second circuit (206 and 208) which during an electrostatic discharge event, keeps the shunt structure 112 conductive for a period of time to discharge electrostatic energy through the shunt structure 112. In this example, the second circuit includes an ESD feedback circuit 206 and ESD control logic 208. The ESD control logic 208 controls the ESD feedback circuit 206 to provide an ESD control signal 210 to the end inverter 212 of the inverter chain 104 during an ESD event. The ESD feedback circuit 206 is coupled to the first circuit 204 and 104. The ESD control logic 208 is coupled to the shunt structure 112.

Figure 3:
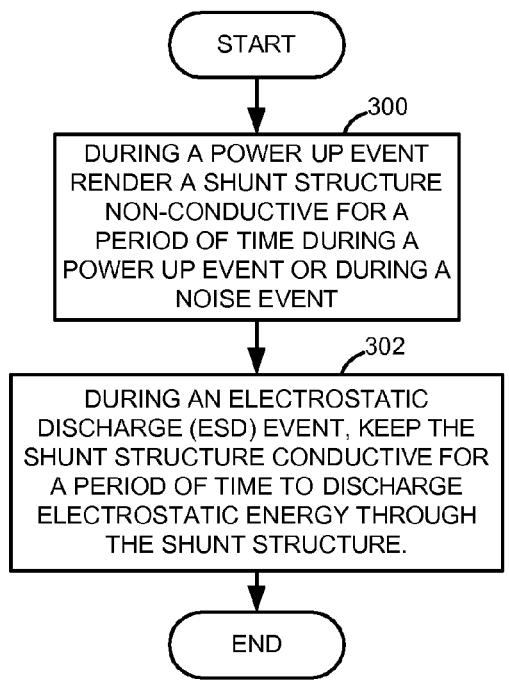
FIG. 3 is a flowchart illustrating one example of a method in accordance with one embodiment set forth in the disclosure.

Referring also to FIG. 3, in operation, during a power up event or a noise event when power is settled, the RC circuit 204 has a small enough time constant to charge the capacitor 205 via resistor 207 quickly and keeps the input of the first inverter 214 of the inverter chain 104 high thereby keeping the output of the end inverter 212 low to ensure that the shunt structure 112 is in an off state. As such, the shunt structure 112 is rendered non-conductive during a power up event or during a noise event that may occur on the power/ground node during normal operation. This is shown in block 300. In block 302, the method includes, during an electrostatic discharge event, keeping the shunt structure 112 conductive for a period of time discharge electrostatic energy through the shunt structure. This is accomplished through the ESD feedback circuit 206 and the ESD control logic 208 as further described below. Accordingly, during a power up event or during a noise event, a process includes rendering a shunt structure non-conductive for a period of time during the power up event or during the noise event. In addition the process includes during an electrostatic discharge (ESD) event, also keeping the shunt structure conductive for a period of time to discharge electrostatic energy through the shunt structure.

Figure 4:
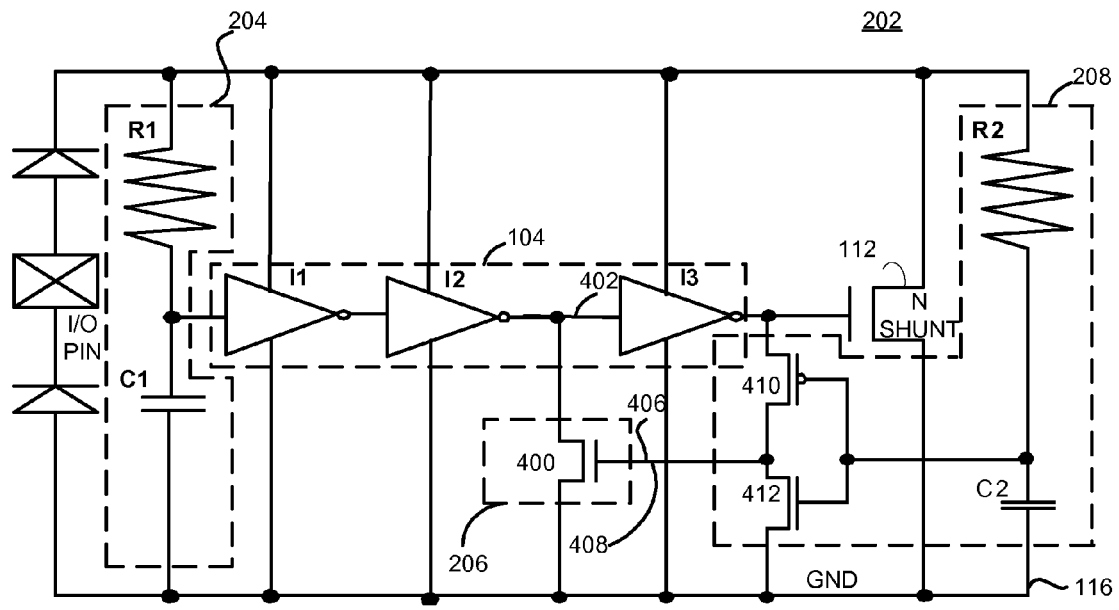
FIG. 4 is a circuit diagram illustrating one example of an electrostatic discharge protection circuit and power up protection circuit in accordance with another example set forth in the disclosure.

FIG. 4 illustrates in more detail one example of the ESD feedback circuit 206 and the ESD control logic 208. As shown, the ESD control logic 208 includes a second resistor/capacitor RC circuit that has a longer time constant than the time constant of the first RC circuit 204. Also in this example, the ESD feedback circuit 206 includes an NMOS transistor 400 that is operably coupled to an input 402 of the end inverter of the chain of inverters 104. A terminal of the feedback transistor 400 is also connected to the ground node 116 and its input terminal, in this example a gate 406 receives a feedback control signal 408 from the ESD control logic 208.

The ESD control logic 208 in this example includes another RC circuit that coupled to the power node and the ground node as well as the control logic that is coupled to the RC circuit and to the feedback transistor. The control logic in this example is made up of a PMOS transistor 410 and an NMOS transistor 412. The PMOS transistor 410 has a terminal shown as gate 406, coupled to a gate of the feedback transistor 400 and another terminal coupled to a gate of the shunt structure 112. The PMOS transistor 410 has another terminal (gate) that is operably coupled to the gate of the NMOS transistor 412 such that the gates of the transistors are coupled to each other and to the resistor 405 and capacitor 407 of the second RC circuit. The NMOS transistor 412 also has a terminal operably coupled to the gate of the feedback transistor 400 and to a terminal of the PMOS transistor 410. Another terminal of the NMOS transistor is coupled to the ground node 116 as shown. As such during operation the RC circuit 204 has a time constant that is small enough so that the capacitor C1 charges quickly so that the shunt transistor 112 is shut off during a power up condition. Although the capacitor in the circuit 208 may also start to charge, the inverter chain 104 keeps the shunt transistor off in a non-conductive state. The ESD control logic and ESD feedback circuit, during an ESD condition keeps the shunt transistor conductive and defines the shunt on time. The RC circuit 204 turns on the shunt transistor on quickly during an ESD condition but does not turn it off until the RC constant 208 allows it to turn off. During power up mode no current is sunk through the shunt transistor so there is no current draw and no overheating of circuits in the integrated circuit. The RC time constant of the ESD control logic 208 which may be, for example, one microsecond or more, keeps the shunt transistor in a conductive mode during an ESD event. As such, the shunt device performance during an ESD event control is different to compare with shunt device performance during a power up event. In prior known systems of FIG. 1, the only RC circuit employed is one that has a large time constant so that during power up mode the shunt device could conduct current and could cause latch-up and potentially damaged the integrated circuit components.

Figure 5:
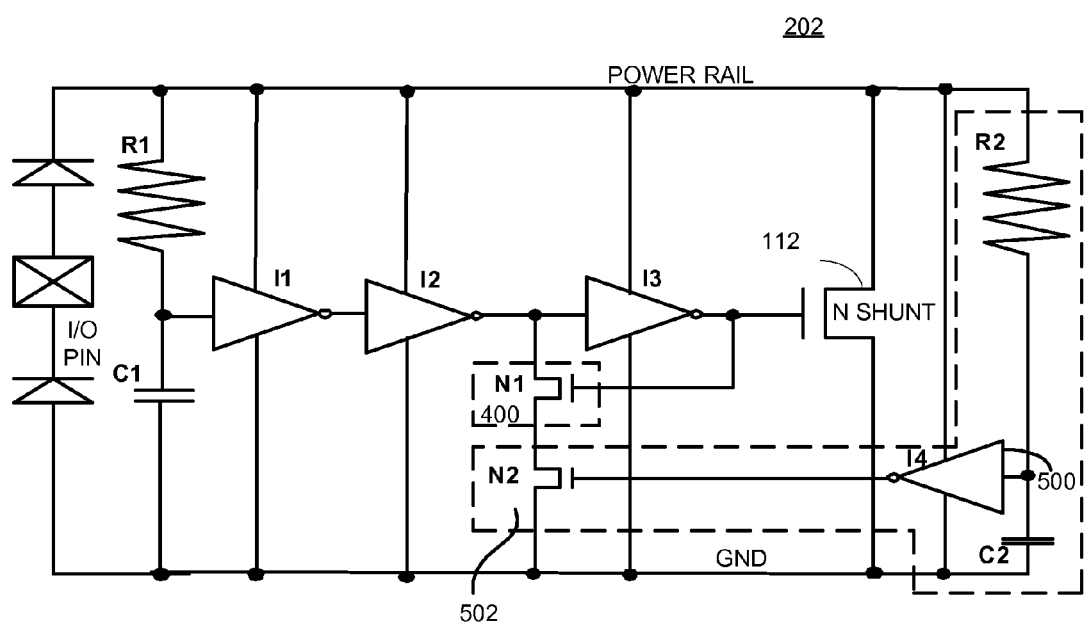
FIG. 5 is a circuit diagram illustrating one example of an electrostatic discharge protection circuit and power up protection circuit in accordance with another example set forth in the disclosure.

FIG. 5 is another embodiment of the circuit 202 and as shown, in this embodiment includes another inverter 500 and an NMOS transistor 502. The inverter has an input that is connected to the resistor R2 and capacitor C2 of the RC circuit in the ESD control logic and its output is connected to the input of the NMOS transistor N2. A terminal of the NMOS transistor N2 is coupled to a terminal of the feedback transistor N1. The feedback transistor N1 has a gate coupled to the output of the end inverter in the inverter chain as well as the gate of the shunt transistor. Another node of the feedback transistor is connected to the input of the end inverter in the chain. The operation is similar as described above.

Figure 6:
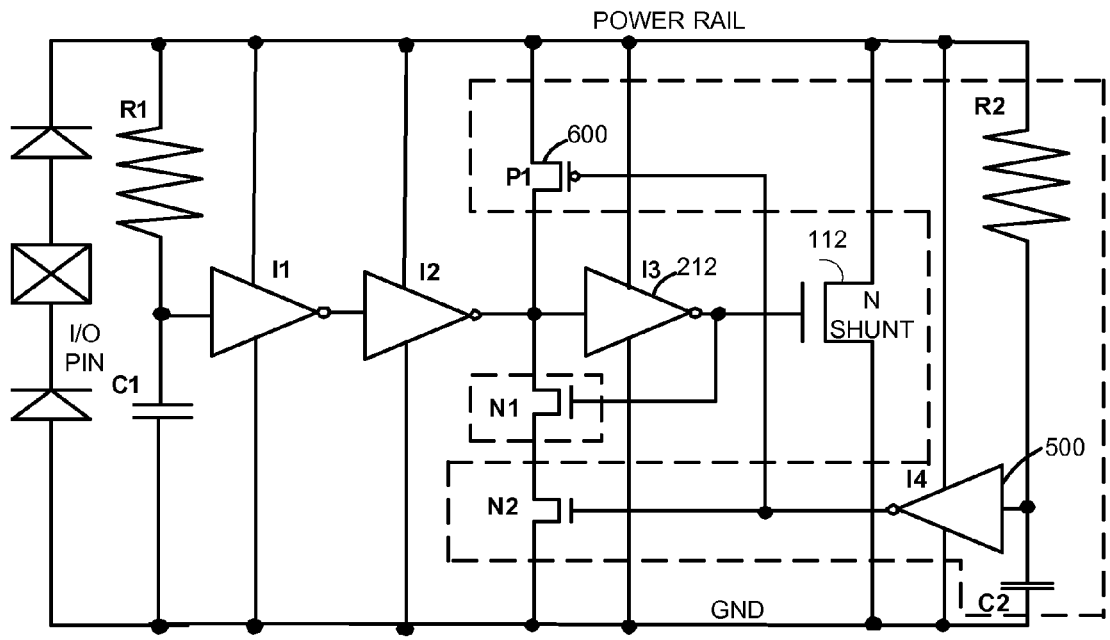
FIG. 6 is a circuit diagram illustrating one example of an electrostatic discharge protection circuit and power up protection circuit in accordance with another example set forth in the disclosure.

FIG. 6 illustrates yet another embodiment of the circuit 202 wherein in this embodiment, a PMOS transistor 600 is coupled to the power node and to a terminal of the feedback transistor and the input of the end inverter 212. A gate or input terminal of the PMOS transistor 600 is coupled to the output of the inverter 500. Another terminal is coupled to the power rail. PMOS transistor 600 provides high level at the input of inverter 212 during normal operation (when power is settled) together with first RC circuit (C1R1). That will improve circuit immunity to power/ground noise during normal operation.

It will recognized that various examples shown herein may be modified or other examples may be employed using different circuitry and that although shown as NMOS and PMOS technology, any suitable technology may be employed. Shunt transistor may be cascaded, number of inverters may be changed (or completely avoided), RC circuits may be replaced with CR circuits, any other circuits or programs could be used to make shunt device operative during ESD event and keep shunt device disabled during power-up conditions, or noisy power/GND conditions during normal job operation, etc.

Among other advantages, the latch up conditions are eliminated and probability for chip or integrated circuit damage due to a possible power rail to ground shortage condition during power up is reduced. In addition, efficient ESD protection is also provided.

In addition, integrated circuit design systems, such as workstation based systems or other computer based integrated circuit design system execute code that is stored on a computer readable medium, including but not limited to known forms of ROM, RAM, optical storage media, distributed memory on multiple network elements including Internet servers and other executable instruction media. The instructions may be in any suitable form including but not limited to VHDL, RTL, Verilog, GDS files or any suitable format. The above circuit(s) can be layed out using stored executable instructions such that the computer readable medium contains executable instructions that when executed by one or more processors in the integrated circuit design system, cause an integrated circuit design system to layout a circuit that includes the shunt structure (e.g., transistor) interposed between a power node rail and a ground node rail. In addition the computer readable medium contains executable instructions that when executed by one or more processors in the integrated circuit design system, cause an integrated circuit design system to layout a circuit that includes power up control logic operative during a power up event to render the shunt structure non-conductive for a period of time during the power up event or during a noise event. In addition the computer readable medium contains executable instructions that when executed by one or more processors in the integrated circuit design system, cause an integrated circuit design system to provide ESD feedback and control logic operative during an electrostatic discharge (ESD) event, to keep the shunt transistor conductive for a period of time to discharge electrostatic energy through the shunt structure. The other circuits may also be layed out accordingly using the stored executable instructions so that an integrated circuit may be fabricated therefrom.

The above detailed description of the invention and the examples described therein have been presented for the purposes of illustration and description only and not by limitation. It is therefore contemplated that the present invention cover any and all modifications, variations or equivalents that fall within the spirit and scope of the basic underlying principles disclosed above and claimed herein.

What is claimed is:

1. An integrated circuit comprising:
   a shunt structure interposed between a power node and a ground node;
   first circuit operative during a power up event or during a noise event to render the shunt structure non-conductive for a period of time during the power up event or during the noise event;
   second circuit operative during an electrostatic discharge (ESD) event, to keep the shunt structure conductive for a period of time to discharge electrostatic energy through the shunt structure; and
   wherein the second circuit comprises an ESD feedback circuit operatively coupled to the first circuit, and comprises ESD control logic that is distinct from the ESD feedback circuit and is operatively coupled to the shunt structure.

2. The integrated circuit of claim 1 wherein the shunt structure is comprised of a transistor and wherein the first circuit comprises a first resistor/capacitor (RC) circuit having a first time constant and the second circuit comprises a second resistor/capacitor (RC) circuit having a second and longer time constant than the first time constant.

3. The integrated circuit of claim 1 wherein the first circuit is operative to turn on the shunt structure during an ESD condition and wherein the second circuit prevents the shunt structure from turning off for a period of time during the ESD condition.

4. The integrated circuit of claim 1, wherein the ESD control logic is distinct and separate from components necessary for the first circuit to render the shunt structure non-conductive.

5. The integrated circuit of claim 1, wherein the ESD control logic is disposed electrically between a gate of the shunt structure and a gate of the ESD feedback circuit.

6. The integrated circuit of claim 1, wherein the ESD control logic uses a shunt gate voltage as an input and provides an output voltage to the ESD feedback circuit.

7. The integrated circuit of claim 1, wherein the second circuit comprises ESD control logic operatively coupled to the ESD feedback circuit to control operation of the ESD feedback circuit based on the operational status of the shunt structure.

8. An integrated circuit comprising:
   a shunt transistor interposed between a power node and a ground node;
   a first RC circuit coupled to the power node and the ground node;
   a chain of inverters having a front inverter operatively coupled to the first RC circuit and an end inverter operatively coupled to an input of the shunt transistor;
   a feedback transistor operatively coupled to an input of the end inverter;
   ESD control logic comprising:
      a second RC circuit coupled to the power node and the ground node, and
      control logic operatively coupled to the second RC circuit and to the feedback transistor, the control logic being distinct from the chain of inverters.

9. The integrated circuit of claim 8 wherein the ESD control logic comprises:
   a PMOS transistor having a terminal operatively coupled to a gate of the shunt transistor, an input that is operatively coupled to an input of an NMOS transistor and wherein the inputs are operatively coupled to the resistor and capacitor of the second RC circuit; and
   the NMOS transistor having a terminal operatively coupled to a gate of the feedback transistor.

10. The integrated circuit of claim 8 wherein the control logic comprises:
   a transistor operatively coupled to a terminal of the feedback transistor and having a terminal coupled to the ground node;
   an inverter having an input terminal operatively coupled to the resistor and capacitor of the second RC circuit, and an output terminal coupled to an input terminal of the transistor.

11. The integrated circuit of claim 8 wherein the control logic comprises:
   an NMOS transistor operatively coupled to a terminal of the feedback transistor and having a terminal coupled to the ground node;
   an inverter having an input terminal operatively coupled to the resistor and capacitor of the second RC circuit, and an output terminal coupled to an input terminal of the transistor; and
   a PMOS transistor having a gate coupled to the output of the inverter and to the input of the NMOS transistor, and having a first terminal coupled to the input of the end inverter in the chain of inverters and to the feedback transistor, and a second terminal coupled to the power node.

12. The integrated circuit of claim 8, wherein the ESD control logic uses a voltage from the second RC circuit as an input to the ESD control logic and provides an output to the feedback transistor.

13. The integrated circuit of claim 12, wherein the ESD control logic further uses a voltage from the gate of the shunt transistor as an input.

14. The integrated circuit of claim 8, wherein the ESD control logic includes at least one element beyond those elements of the first RC circuit and the chain of inverters.

15. The integrated circuit of claim 8, wherein the ESD control logic is operatively coupled to the ESD feedback circuit to control operation of the ESD feedback circuit based on the operational status of the shunt transistor and the second circuit.

16. A device comprising the integrated circuit of claim 8.

17. A nontransitory computer readable storage medium comprising executable instructions that when executed cause an integrated circuit design system to layout a circuit that comprises:
 a shunt structure interposed between a power node and a ground node;
 first circuit operative during a power up event to render the shunt structure non-conductive for a period of time during a power up event or during a noise event;
 second circuit operative during an electrostatic discharge (ESD) event, to keep the shunt transistor conductive for a period of time to discharge electrostatic energy through the shunt structure; and
 executable instructions that when executed cause the integrated circuit design system to layout a circuit that comprises an ESD feedback circuit to be operatively coupled to the first circuit, and that comprises ESD control logic that is distinct from the ESD feedback circuit and is operatively coupled to the shunt structure.

* * * * *